US006797589B2

(12) United States Patent  
Adams et al.

(10) Patent No.: US 6,797,589 B2  
(45) Date of Patent: Sep. 28, 2004

(54) INSULATING MICRO-STRUCTURE AND METHOD OF MANUFACTURING SAME

(75) Inventors: Scott G. Adams, Ithaca, NY (US); Scott A. Miller, Ithaca, NY (US)

(73) Assignee: Kionix, Inc., Ithaca, NY (US)

( * ) Notice: Subject to any disclaimer, the term of this patent is extended or adjusted under 35 U.S.C. 154(b) by 0 days.

(21) Appl. No.: 10/322,990

(22) Filed: Dec. 18, 2002

(65) Prior Publication Data

US 2003/0124758 A1 Jul. 3, 2003

Related U.S. Application Data

(60) Provisional application No. 60/342,049, filed on Dec. 18, 2001.

(51) Int. Cl.[7] ............................................. H01L 21/76
(52) U.S. Cl. .................... 438/426; 438/437; 257/508
(58) Field of Search ................. 257/506–510; 438/410, 424–437, 444, 452, 635, 760–773, 400, 421, 294–297, 353–363

(56) References Cited

U.S. PATENT DOCUMENTS

| | | | | |
|---|---|---|---|---|
| 4,437,226 A | * | 3/1984 | Soclof | .......................... 29/577 |
| 4,714,520 A | * | 12/1987 | Gwozdz | ...................... 437/228 |
| 5,426,070 A | | 6/1995 | Shaw et al. | |
| 5,719,073 A | | 2/1998 | Shaw et al. | |
| 5,846,849 A | | 12/1998 | Shaw et al. | |
| 5,981,402 A | | 11/1999 | Hsiao et al. | |
| 6,020,272 A | | 2/2000 | Fleming | |
| 6,051,866 A | | 4/2000 | Shaw et al. | |
| 6,239,473 B1 | | 5/2001 | Adams et al. | |
| 6,613,675 B2 | * | 9/2003 | Robinson et al. | ........... 438/690 |

OTHER PUBLICATIONS

Design of Low Actuation Voltage RF MEMS Switch, 0–7803–5687–X—2000 IEEE.

\* cited by examiner

*Primary Examiner*—Matthew Smith  
*Assistant Examiner*—Calvin Lee  
(74) *Attorney, Agent, or Firm*—Jones, Tullar & Cooper, P.C.

(57) ABSTRACT

A method of manufacturing an insulating micro-structure by etching a plurality of trenches in a silicon substrate and filling said trenches with insulating materials. The trenches are etched and then oxidized until completely or almost completely filled with silicon dioxide. Additional insulating material is then deposited as necessary to fill any remaining trenches, thus forming the structure. When the top of the structure is metallized, the insulating structure increases voltage resistance and reduces the capacitive coupling between the metal and the silicon substrate. Part of the silicon substrate underlying the structure is optionally removed further to reduce the capacitive coupling effect. Hybrid silicon-insulator structures can be formed to gain the effect of the benefits of the structure in three-dimensional configurations, and to permit metallization of more than one side of the structure.

16 Claims, 3 Drawing Sheets

INSULATING MICRO-STRUCTURE AND METHOD OF MANUFACTURING SAME

CROSS-REFERENCE TO RELATED APPLICATIONS

This application claims priority from U.S. Provisional Application Ser. No. 60/342,049 filed Dec. 18, 2001 and entitled METHODS FOR MICROSTRUCTURE MANUFACTURE AND APPARATUSES USING SAME, incorporated herein by reference.

FIELD OF THE INVENTION

This invention relates generally to the field of microstructures, and more particularly to a method for making insulating micro-structures.

BACKGROUND OF THE INVENTION

When a micro-structure such as a microelectromechanical (MEMS) device is constructed, the most common substrate used is silicon. Silicon is a semiconductor, and MEMS devices must consider and control that property in the design and manufacture of MEMS products. As a MEMS device is fabricated, part of the silicon oxidizes to form silicon oxide ("SiO"), silicon dioxide ("SiO2"), or a similar compound of oxidized silicon ("SiOx") (together, "oxidized silicon"), all of which are insulators. When the oxidized silicon is not desired for the application, it is removed using an oxide-specific etch. For some applications, the oxidized silicon is retained for use as an insulator between metal applied on top of the device and the silicon substrate. Even so, this form of insulation is inadequate for many applications because metal-oxide-silicon interfaces are sources of parasitic capacitance that impair the performance of certain devices, such as those relying on opposing metal layers for capacitive actuation and transduction. For example, the large area provided by the structure sidewalls in U.S. Pat. No. 5,719,073 (Shaw et al.) and the metal-oxide-silicon structure directly results in a large parasitic capacitance. For many MEMS devices, the variable capacitance provided by opposing structure sidewalls can be exceeded by the parasitic capacitance to the silicon substrate. When capacitance detection is used to measure the displacement of a MEMS sensor, this large parasitic capacitance to the substrate is a source of noise.

Various techniques to reduce parasitic capacitance are disclosed in U.S. Pat. Nos. 5,426,070 and 6,239,473. These techniques vary in effectiveness, but none offers a perfect solution. The processes for forming actuators and isolation joints, and releasing them from the underlying silicon substrate, are discussed in U.S. Pat. No. 6,239,473 (Adams et al.) entitled TRENCH ISOLATION PROCESS FOR MICROELECTROMECHANICAL DEVICES; U.S. Pat. No. 5,719,073 (Shaw et al.) entitled MICROSTRUCTURES AND SINGLE-MASK, SINGLE CRYSTAL PROCESS FOR FABRICATION THEREOF; U.S. Pat. No. 5,846,849 (Shaw et al.) entitled MICROSTRUCTURE AND SINGLE MASK, SINGLE-CRYSTAL PROCESS FOR FABRICATION THEREOF; U.S. Pat. No. 6,051,866 (Shaw et al.) entitled MICROSTRUCTURES AND SINGLE MASK, SINGLE-CRYSTAL PROCESS FOR FABRICATION THEREOF; S. G. Adams, et. al., "Single-Crystal Silicon Gyroscope with Decoupled Drive and Sense", in Micromachined Devices and Components V, Patrick J. French, Eric Peeters, Editors, Proceedings of SPIE Vol. 3876, 74–83 (1999); K. A. Shaw, Z. L. Zhang, and N. C. Macdonald, "SCREAM I: A single mask, single-crystal silicon process for microelectromechanical structures", Sensors and Actuators A, vol. 40, pp. 63–70 (1994); and Z. L. Zhang, N. C. MacDonald, "A rie process for submicron, silicon electromechanical structures", J. Micromech. Microeng., v2, pp. 31–38 (1992), all of which are incorporated herein by reference in their entirety.

SUMMARY OF THE INVENTION

Briefly stated, a method of manufacturing insulating structures by etching and filling a plurality of trenches in close proximity in a silicon substrate. The trenches are configured such that, during oxidation, the silicon substrate that separated the trenches is completely oxidized and the former trenches become filled or nearly filled with oxidized silicon. Another layer of insulation, such as more oxidized silicon, silicon nitride, or some other insulating substance, is then deposited on top of the oxidized silicon to fill any remaining trenches, thus forming an insulating structure with a relatively smooth surface. When the top of this insulating structure is metallized, the structure reduces the capacitive coupling between the metal and the silicon substrate. The trenches can be arranged arbitrarily in the substrate to define patterns as desired. Part of the silicon substrate underlying the structure optionally can be removed to reduce further the capacitive coupling effect. Metal also can be applied optionally to the top and side(s) of the structure as particular applications may require.

According to an embodiment of the invention, a method of manufacturing an insulating microstructure includes the steps of (a) providing a silicon substrate; (b) etching a plurality of trenches in the silicon substrate; (c) oxidizing the plurality of trenches until the silicon between the trenches is fully oxidized; and (d) depositing an insulator to fill what remains of the trenches after the step of oxidizing.

According to an embodiment of the invention, an insulating micro-structure is formed by the steps of (a) providing a silicon substrate; (b) etching a plurality of trenches in the silicon substrate; (c) oxidizing the plurality of trenches until the silicon between the trenches is fully oxidized; and (d) depositing an insulator to fill what remains of the trenches after the step of oxidizing.

According to an embodiment of the invention, an insulating micro-structure is formed by the steps of (a) providing a silicon substrate; (b) etching a plurality of trenches in the silicon substrate; (c) oxidizing the plurality of trenches until the silicon between the trenches is fully oxidized; (d) depositing an insulator to fill what remains of the trenches after the step of oxidizing; (e) depositing a pattern of metal on a side of the structure opposite the silicon substrate; and (f) removing the silicon substrate from beneath a portion of the structure.

According to an embodiment of the invention, a method of manufacturing a hybrid silicon-insulator structure includes the steps of (a) providing a silicon substrate; (b) etching a plurality of trenches in the silicon substrate wherein the trenches are spaced sufficiently apart to prevent the silicon substrate between the trenches from being completely oxidized during the step of oxidizing; (c) oxidizing the plurality of trenches; and (d) depositing an insulator to fill what remains of the trenches after the step of oxidizing, thus forming the hybrid silicon-insulator structure.

According to an embodiment of the invention, a hybrid silicon-insulator structure is formed from the steps of providing a silicon substrate; etching a plurality of trenches in the silicon substrate wherein the trenches are spaced sufficiently apart to prevent the silicon substrate between the trenches from being completely oxidized during the step of oxidizing; and depositing an insulator to fill what remains of the trenches after the step of oxidizing, thus forming the hybrid silicon-insulator structure.

According to an embodiment of the invention, a hybrid silicon-insulator structure is formed by the steps of providing a silicon substrate; etching a plurality of trenches in the silicon substrate wherein the trenches are spaced sufficiently apart to prevent the silicon substrate between the trenches from being completely oxidized during the step of oxidizing; depositing an insulator to fill what remains of the trenches after the step of oxidizing, thus forming the hybrid silicon-insulator structure; depositing a pattern of metal on a side of the structure furthest away from the silicon substrate; and removing the silicon substrate from beneath a portion of the structure.

According to an embodiment of the invention, a hybrid silicon-insulator structure is formed by the steps of providing a silicon substrate; etching a plurality of trenches in the silicon substrate wherein the trenches are spaced sufficiently apart to prevent the silicon substrate between the trenches from being completely oxidized during the step of oxidizing; depositing an insulator to fill what remains of the trenches after the step of oxidizing, thus forming the hybrid silicon-insulator structure; depositing a pattern of metal on a side of the structure furthest away from the silicon substrate; removing the silicon substrate from beneath a portion of the structure; and adding metal to the top and side(s) of the hybrid silicon-insulator structure.

DETAILED DESCRIPTION OF THE PREFERRED EMBODIMENT

Figure 1:
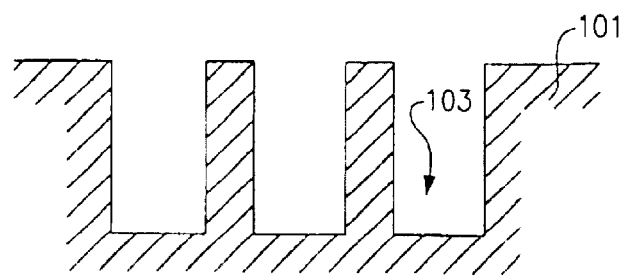
FIG. 1 illustrates a step in forming an insulating structure according to the present invention.
Figure 2:
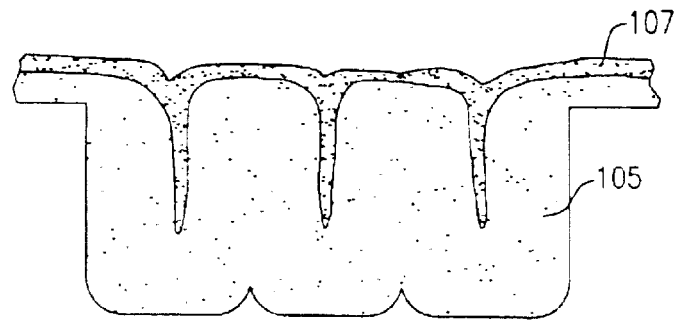
FIG. 2 illustrates a step in forming an insulating structure according to the present invention.
Figure 3:
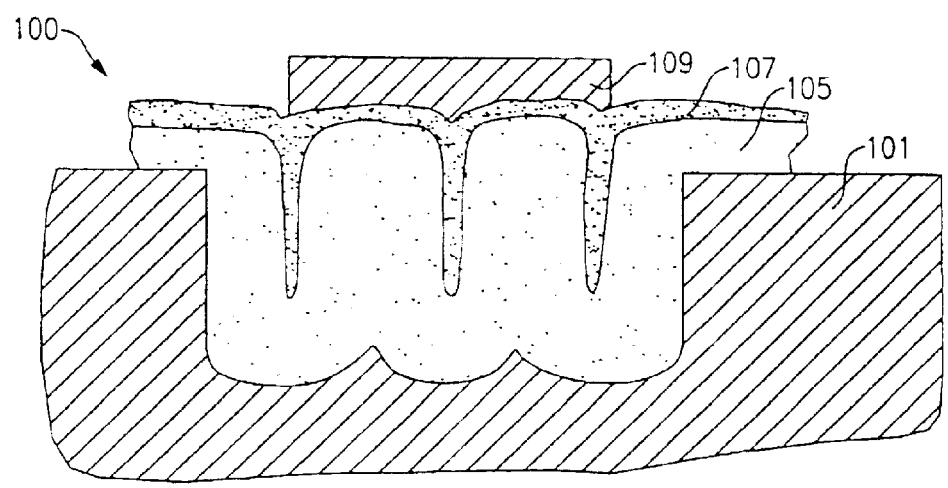
FIG. 3 illustrates a step in forming an insulating structure according to the present invention.
Figure 4:
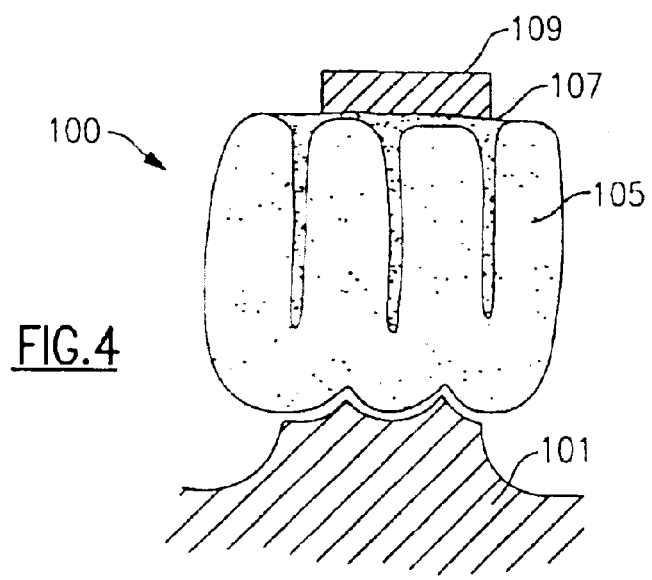
FIG. 4 illustrates a step in forming an insulating structure according to the present invention.

Referring to FIGS. 1–4, a cross-section of an insulating micro-structure 100 is shown in various stages of construction. A region of oxidized silicon is preferably formed by first cutting a number of parallel trenches 103 in a silicon substrate 101, using techniques the same as or similar to those disclosed in U.S. Pat. No. 6,239,473 mentioned above. The trenches do not have to be parallel or straight as long as the trench-substrate structure is such that the silicon between the trenches fully oxidizes as explained below. In FIG. 2, silicon substrate 101 is exposed to oxidizing agents and temperatures so that the silicon between the trenches fully oxidizes to form an insulation layer 105. As the silicon between the trenches oxidizes, its volume increases by a factor of two to three. Therefore, the widths of the initial trenches 103 are carved at a width relative to the remaining silicon projections, so that as those silicon projections oxidize, the trenches essentially fill themselves with silicon dioxide. To fill any residual trench between the faces of the oxide growth fronts, a layer of insulation 107 is preferably deposited, using such known techniques as plasma enhanced CVD (PECVD), low temperature oxidation (LTO), silicon nitride deposition, or other method, on insulation layer 105 to fill in whatever trenches remain. As shown in FIG. 3, patterned metal 109 is laid atop the insulating structure 100 so formed. As shown in FIG. 4, silicon substrate 101 optionally remains to be used as a conductor, while metal 109, atop insulation layers 105, 107, is used as a conductor for another signal. This technique provides good electrical isolation between patterned metal 109 and silicon substrate 101 for very high voltage stand-off capability, with reduced stray capacitances and stray inductances.

This method offers improved performance to devices that require transmission of voltages and/or currents that are relatively high for MEMS by reducing loss of signal to ground and increasing breakdown strength. This method also offers improved performance to any MEMS devices that employ capacitive sensors, because as parasitic capacitance is reduced, so is one of the primary noise sources in capacitance based displacement sensors.

When the signal is on-chip, it can be routed as needed. When the signal path needs to go on top of released structures, a transition needs to be made. On flat surfaces, the metal is easy to pattern and align with other structures because the tolerances are large, e.g., greater than a few microns. On released structures the tolerances need to be submicron and therefore are dealt with in another fashion. Typically metal is patterned on release structures at the same time that the silicon structure is defined; this is referred to as a self-aligned process. The problem with using the typical process in the present invention is that the traditional method described in the referenced patents and publications has very little voltage stand-off protection along the sides of the oxide structures.

To avoid this problem, a blend of the traditional silicon structure fabrication method and the trench isolation process is used. By placing the oxide trenches in a location coincident with the sides of the silicon structure to be fabricated, a silicon structure with very thick sidewalls is obtained which has a very high voltage standoff capability. Furthermore, the metal can be patterned on top of this hybrid structure as a self-aligned part of the fabrication process. At this point, the metal can be routed on top of a hybrid silicon-thick-oxide-sidewall structure that is released from the substrate, deposited preferentially on one or more sides of the structure as desired, or both, as desired.

Figure 6:
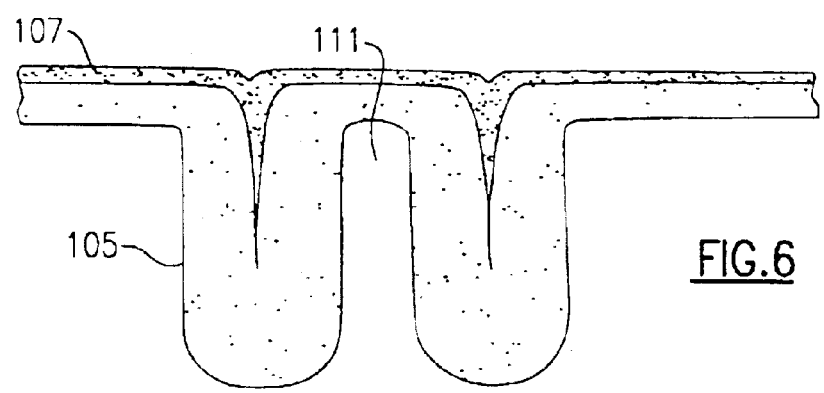
FIG. 6 illustrates a step in forming a hybrid silicon-insulator structure according to the present invention.

Referring to FIGS. 5–8, a cross-section of a hybrid silicon-insulator structure 112 is shown in various stages of construction. A region of silicon dioxide is preferably formed by first cutting a number of trenches 103 in a silicon substrate 101, using techniques the same as or similar to those disclosed in U.S. Pat. No. 6,239,473 mentioned above. The trenches 103 are spaced a distance "d" apart, where "d" is the distance which spaces trenches 103 far enough apart to prevent the complete oxidation of the silicon 101 between trenches 103. Distance "d" is determined knowing that as the silicon oxidizes, the volume increases by a factor of two to three. In FIG. 6, silicon substrate 101 is exposed to oxidizing agents and temperatures so that part of the silicon oxidizes to form an insulation layer 105, leaving a silicon layer 111 between layer portions 105. To fill any residual trench between the faces of the oxide growth fronts, a layer of insulation 107 is preferably deposited, using such known techniques as plasma enhanced CVD (PECVD), low temperature oxidation (LTO), silicon nitride deposition, or other method, on insulation layer 105 to fill in whatever trenches remain.

Figure 8:
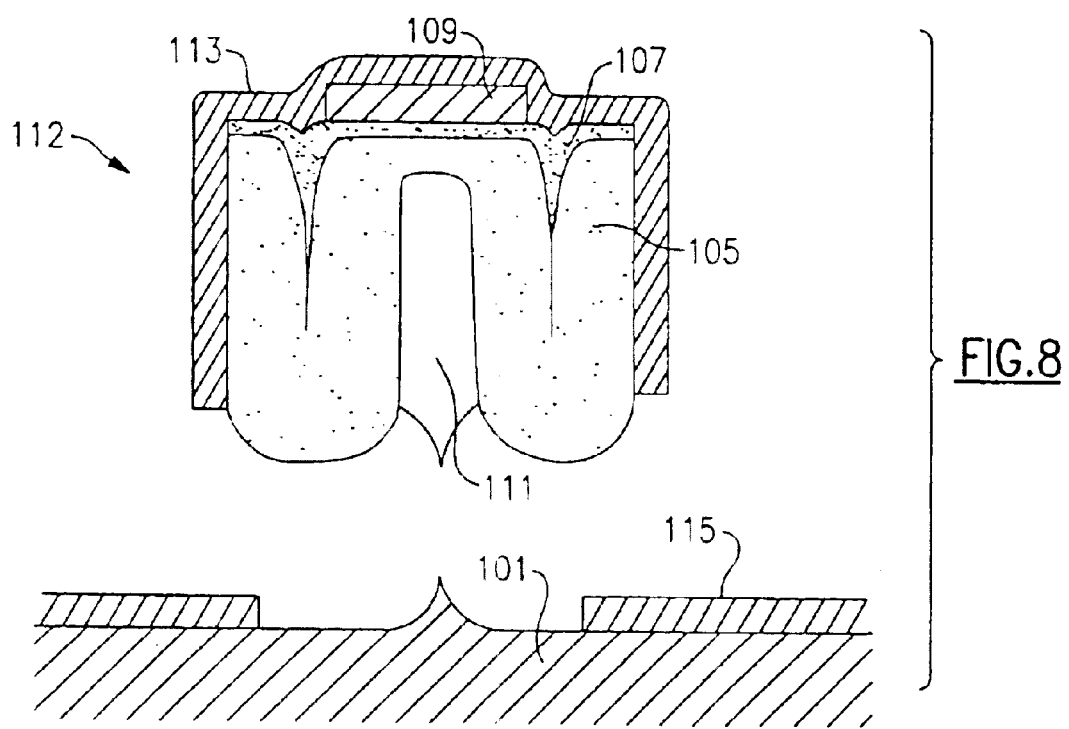
FIG. 8 illustrates a step in forming a hybrid silicon-insulator structure according to the present invention.
Figure 5:
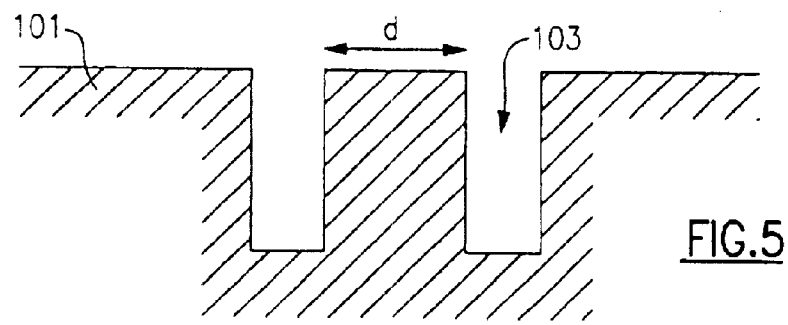
FIG. 5 illustrates a step in forming a hybrid silicon-insulator structure according to the present invention.
Figure 7:
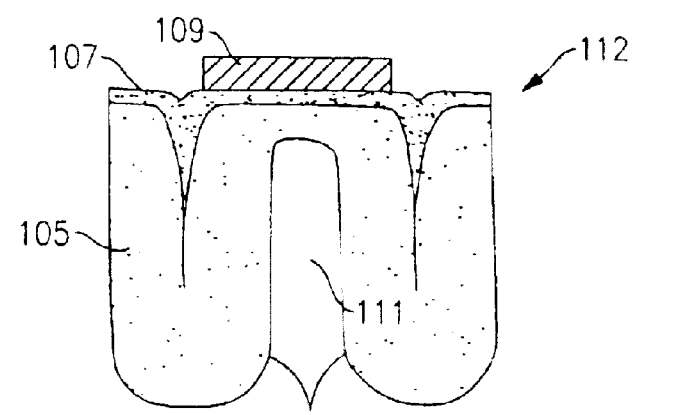
FIG. 7 illustrates a step in forming a hybrid silicon-insulator structure according to the present invention.
Figure 7:

As shown in FIG. 7, patterned metal 109 is laid atop the hybrid silicon-insulator structure 112 so formed. As shown in FIG. 8, silicon substrate 101 optionally remains to be used as a conductor, while patterned metal 109 atop the insulators 105, 107 is used as a conductor for another signal. This technique provides good electrical isolation between patterned metal 109 and silicon substrate 101 for very high voltage stand-off capability, increased breakdown resistance, and reduced stray capacitances and stray inductances. For some applications, metal 113 is deposited atop and on the side(s) of the insulation layers 105, 107, while metal 115 is patterned on substrate 101.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. A method of manufacturing an insulating micro-structure, comprising the steps of:
   providing a silicon substrate;
   etching a plurality of trenches in said silicon substrate;
   oxidizing said plurality of trenches until the silicon between said trenches is fully oxidized;
   depositing an insulator to fill what remains of said trenches after the step of oxidizing; and
   depositing a pattern of metal on a side of said micro-structure opposite said silicon substrate.

2. A method according to claim 1, further comprising the step of removing said silicon substrate from beneath a portion of said micro-structure.

3. A product formed by the method of claim 2.

4. A method according to claim 1, further comprising the step of releasing said micro-structure from said silicon substrate.

5. A product formed by the method of claim 3.

6. A product formed by the method of claim 1.

7. A method of manufacturing an insulting micro-structure, comprising the steps of:
   providing a silicon substrate;
   etching a plurality of trenches in said substrate;
   oxidizing said plurality of trenches until a majority of a volume of said trenches becomes filled with oxidized silicon;
   wherein said trenches are spaced apart sufficient to prevent said silicon substrate between said trenches from being completely oxidized during said step of oxidizing;
   depositing an insulator to fill what remains of said trenches after the step of oxidizing; and
   depositing a pattern of metal on a side of said micro-structure furthest away from said silicon substrate, thus forming said insulating micro-structure.

8. A method according to claim 7, further comprising the step of removing said silicon substrate from beneath a portion of said micro-structure.

9. A product formed by the method of claim 8.

10. A method according to claim 7, further comprising the step of releasing said micro-structure from said silicon substrate.

11. A product formed by the method of claim 10.

12. A method according to claim 7, wherein a first side of said micro-structure is a side of said micro-structure furthest away from said silicon substrate, a second side of said micro-structure is a side of said micro-structure adjacent said first side, and a third side of said micro-structure is a side of said micro-structure adjacent to said first side, but wherein said second and third sides are not a same side of said micro-structure, the method further comprising the step of depositing a pattern of metal on said first side and on at least one of said second and third sides of said micro-structure.

13. A product formed by the method of claim 12.

14. A product formed by the method of claim 7.

15. A method of manufacturing an insulating micro-structure, comprising the steps of:
   providing a silicon substrate;
   etching a plurality of trenches in said silicon substrate;
   oxidizing said plurality of trenches until the silicon between said trenches is fully oxidized;
   depositing an insulator to fill what remains of said trenches after the step of oxidizing; and
   releasing said micro-structure from said silicon substrate.

16. A method of manufacturing an insulting micro-structure, comprising the steps of:
   providing a silicon substrate;
   etching a plurality of trenches in said substrate;
   oxidizing said plurality of trenches until a majority of a volume of said trenches becomes filled with oxidized silicon;
   wherein said trenches are spaced apart sufficient to prevent said silicon substrate between said trenches from being completely oxidized during said step of oxidizing;
   depositing an insulator to fill what remains of said trenches after the step of oxidizing, thus forming said insulating micro-structure; and
   releasing said micro-structure from said silicon substrate.

* * * * *